US007777221B2

(12) United States Patent
Lee et al.

(10) Patent No.: US 7,777,221 B2
(45) Date of Patent: Aug. 17, 2010

(54) ORGANIC SEMICONDUCTING COPOLYMER AND ORGANIC ELECTRONIC DEVICE INCLUDING THE SAME

(75) Inventors: Bang-lin Lee, Suwon-si (KR); Kook-min Han, Suwon-si (KR); Eun-kyung Lee, Seoul (KR); Do-hwan Kim, Seoul (KR); Hyun-sik Moon, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 74 days.

(21) Appl. No.: 12/219,273

(22) Filed: Jul. 18, 2008

(65) Prior Publication Data

US 2009/0189150 A1    Jul. 30, 2009

(30) Foreign Application Priority Data

Jan. 25, 2008    (KR) ...................... 10-2008-0008028

(51) Int. Cl.
*C08G 61/00*    (2006.01)
(52) U.S. Cl. ................................. 257/40; 257/E51.025
(58) Field of Classification Search .................... 257/40, 257/E51.005, E51.025
See application file for complete search history.

(56) References Cited

U.S. PATENT DOCUMENTS 5,625,199 A    4/1997    Baumbach et al.

(Continued)

FOREIGN PATENT DOCUMENTS

| EP | 1434285 | 6/2004 |
|---|---|---|
| EP | 1615237 | 1/2006 |
| EP | 1710266 | 10/2006 |
| EP | 1953155 | 8/2008 |

OTHER PUBLICATIONS

Brennan et al., "Polyfluorenes as Organic Semiconductors for Polymeric Field Effect Transistors", Mat. Res. Soc. Symp. Proc., vol. 771, pp. 157-162 (2003).*

(Continued)

*Primary Examiner*—Thomas L Dickey
(74) *Attorney, Agent, or Firm*—Harness, Dickey & Pierce, P.L.C.

(57) ABSTRACT

An organic semiconducting copolymer according to example embodiments may be represented by Formula 1 below:

(Formula 1)

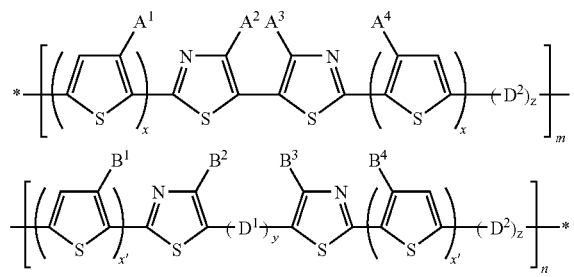

An organic electronic device may include the above organic semiconducting copolymer. The organic semiconducting copolymer according to example embodiments may provide improved solubility, processability, and thin film properties. Consequently, the organic semiconducting copolymer may be used in a variety of electronic devices. A suitable electronic device may be an organic thin film transistor. When an active layer of an organic thin film transistor includes the organic semiconducting copolymer, higher charge mobility and lower breaking leakage current may be achieved.

17 Claims, 2 Drawing Sheets

U.S. PATENT DOCUMENTS

| | | | |
|---|---|---|---|
| 6,107,117 | A | 8/2000 | Bao et al. |
| 6,166,172 | A | 12/2000 | McCullough et al. |
| 6,232,157 | B1 | 5/2001 | Dodabalapur et al. |
| 2004/0124410 | A1* | 7/2004 | Lee et al. .................... 257/40 |
| 2006/0006379 | A1* | 1/2006 | Lee et al. .................... 257/40 |

OTHER PUBLICATIONS

H. Sirringhaus et al.: "High-Resolution Inkjet Printing of All-Polymer Transistor Circuits", www.sciencemag.org, Science, vol. 290, Dec. 15, 2000.

John K. Stille: "The Palladium-Catalyzed Cross-Coupling Reactions of Organotin Reagents with Organic Electrophiles", VCH, Angew Chem. Int. Ed. Engl. 25, Copyright 1986, pp. 508-524.

Norio Miyaura et al.: "Palladium-Catalyzed Inter- and Intramolecular Cross-Coupling Reactions of B-Alkyl-9-borabicyclo [3.3.1] nonane Derivatives with 1-Halo-1-alkenes or Haloarenes. Syntheses of Functionalized Alkenes, Arenes, and Cycloalkenes Via A Hydroboration-Coupling Sequence", American Chemical Society, 1989.

Takakazu Yamamoto et al.: "Preparation of $\pi$-Conjugated Poly(thiophene-2,5-diyl), Poly(p-phenylene), and Related Polymers Using Zerovalent Nickel Complexes, Linear Structure and Properties of the $\pi$-Conjugated Polymers", American Chemical Society, Macromolecules 1992, pp. 1214-1223.

Chiem Van Pham et al.: "Lithiation Reaction of 2,5-Dibromothiophene. C NMR Spectra of 3-Substituted Derivatives", Department of Chemistry, University of Cincinnati, J. Org. Chem, May 30, 1984, pp. 5250-5253.

European Search Report dated May 13, 2009.

* cited by examiner

ORGANIC SEMICONDUCTING COPOLYMER AND ORGANIC ELECTRONIC DEVICE INCLUDING THE SAME

PRIORITY STATEMENT

This application claims the benefit under 35 U.S.C. §119 to Korean Patent Application No. 10-2008-0008028, filed on Jan. 25, 2008 in the Korean Intellectual Property Office (KIPO), the entire contents of which are incorporated herein by reference.

BACKGROUND

1. Technical Field

Example embodiments relate to an organic semiconducting polymer and an organic electronic device including the polymer.

2. Description of the Related Art

Polyacetylene is a conjugated organic polymer with semiconducting properties. The development of polyacetylene, consequently, has spurred an interest in organic semiconductors. Organic semiconducting materials may provide certain benefits over inorganic semiconducting materials. For example, organic semiconducting materials may be synthesized using various synthesis methods and may be manufactured into fibers or films with relative ease. Additionally, organic semiconducting materials may have improved flexibility, improved conductivity, and/or reduced fabrication costs compared with inorganic semiconducting materials. As a result, research regarding the incorporation of organic semiconducting materials into functional electronic/optical devices has been increasing.

Organic semiconducting materials have been used in organic thin film transistors (OTFT). Generally, a channel layer of an organic thin film transistor is formed of inorganic semiconducting materials (e.g., silicon), which involve higher temperature vacuum processes and higher costs. However, organic semiconducting materials are being used more as displays become larger, cheaper, and more flexible. Unlike silicon thin film transistors, the semiconductor layers of organic thin film transistors may be formed using atmospheric pressure wet processes, thereby avoiding the use of plasma-enhanced chemical vapor deposition (PECVD) processes. Additionally, OTFTs may be manufactured using roll-to-roll processes and may utilize plastic substrates, if suitable or necessary for the intended application, thereby reducing the cost of fabricating the semiconductor device.

Lower molecular or oligomeric organic semiconducting materials, including melocyanine, phthalocyanine, perylene, pentacene, C60, and thiophenoligomer, have been researched by those skilled in the art. For example, a charge mobility of 2.0 $cm^2/Vs$ and a current on/off ratio of $10^9$ or greater has been reported with higher purity pentacene monomeric crystals, as a part of an attempt to increase the charge mobility by controlling the substrate temperature or deposition ratio, thereby increasing the size of thin film crystalline forms or the size of crystalline particles.

Thiophene-based polymers have also been used in OTFTs. The use of thiophene-based polymers may be beneficial with regard to processing, because lower cost, larger-surface processing may be possible with a solution-based processing (e.g., printing technology). Additionally, OTFTs using a thiophene-based polymer may be fabricated at room temperature, thus providing potential energy and cost savings. A polymer-based OTFT device using a polythiophene material may have a current mobility of 0.01~0.02 $cm^2/Vs$. However, commercialization of OTFTs may require a relatively high current on/off ratio and charge mobility, thus requiring current leakage in the off state to be reduced.

SUMMARY

Example embodiments relate to an organic semiconducting copolymer, wherein the copolymer may have thienylthiazole-based repeating units interposed with one or more spacer groups. Example embodiments also relate to an organic electronic device (e.g., organic thin film transistor) including the organic semiconducting copolymer.

An organic semiconducting copolymer according to example embodiments may be represented by Formula 1 below:

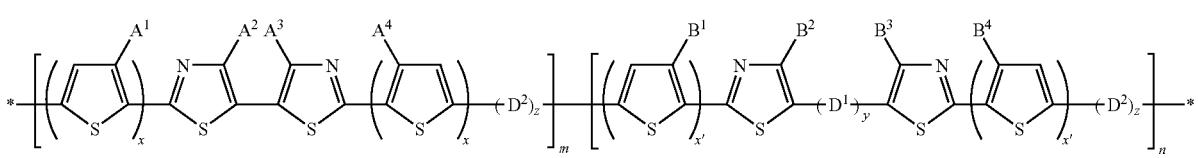

(Formula 1)

wherein $A^1$ to $A^4$ and $B^1$ to $B^4$ may each be independently selected from hydrogen, a hydroxyl group, a $C_1$-$C_{20}$ alkyl group, a $C_1$-$C_{20}$ alkoxyalkyl group, or a $C_1$-$C_{16}$ alkoxy group;

$D^1$ and $D^2$ may each be independently selected from a $C_6$-$C_{30}$ aromatic ring, a $C_4$-$C_{14}$ heteroaromatic ring, or a $C_6$-$C_{30}$ condensed polycyclic group;

x, x', and y may each be an integer in the range of about 1 to 6;

z may be an integer in the range of about 0 to 4; and m and n may each be an integer greater than 0.

The sum of m+n may represent a degree of polymerization of the copolymer. For example, the sum of m+n may be an integer in the range of about 5 to 200. The alkyl group may be a linear, branched, or cyclic alkyl group. The alkoxy group may be a linear, branched, or cyclic alkoxy group. The heteroaromatic ring may contain at least one of a sulfur heteroatom, an oxygen heteroatom, and a selenium heteroatom. The heteroaromatic ring may have 5 members.

$D^1$ and $D^2$ may be selected from the structures below:

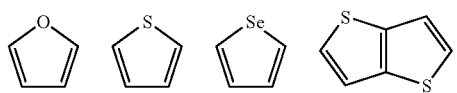

-continued

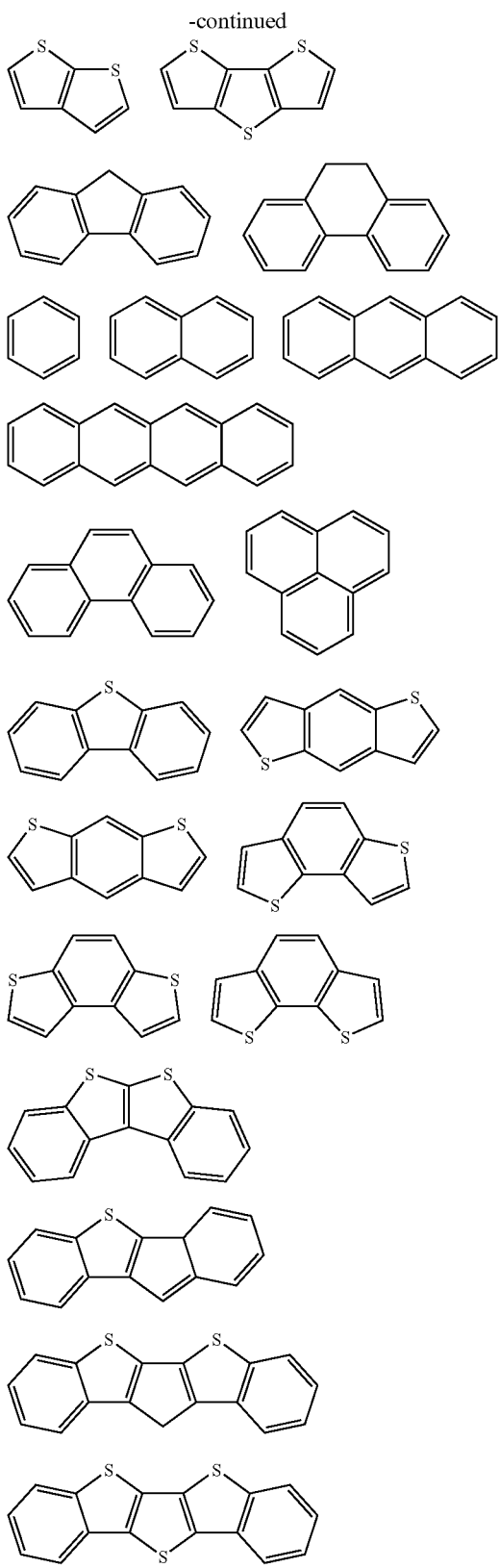

The organic semiconducting copolymer may be formed by copolymerizing the compounds represented by Formulae 2 to 4 below:

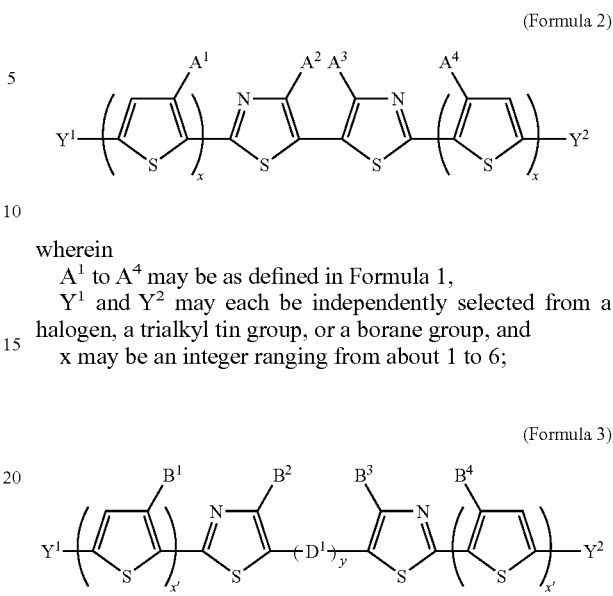

wherein
$A^1$ to $A^4$ may be as defined in Formula 1,
$Y^1$ and $Y^2$ may each be independently selected from a halogen, a trialkyl tin group, or a borane group, and
x may be an integer ranging from about 1 to 6;

wherein
$B^1$ to $B^4$ may be as defined in Formula 1,
$D^1$ may be as defined in Formula 1,
$Y^1$ and $Y^2$ may each be independently selected from a halogen, a trialkyl tin group, or a borane group, and
x' and y may each be an integer ranging from about 1 to 6;

wherein
$D^2$ may be as defined in Formula 1,
$Y^3$ and $Y^4$ may each be independently selected from a halogen, a trialkyl tin group, or a borane group, and
z may be an integer ranging from about 1 to 4.

The organic semiconducting copolymer may be formed with a catalyst represented by one of Formulae 5 and 6 below:

$$PdL_4 \text{ or } PdL_2Cl_2 \qquad \text{(Formula 5)}$$

wherein
L may be a ligand selected from triphenylphosphine (PPh$_3$), triphenylarysine (AsPh$_3$), or triphenylphosphite (P(OPh)$_3$);

$$NiL' \text{ or } NiL'Cl_2 \qquad \text{(Formula 6)}$$

wherein
L' may be a ligand selected from 1,5-cyclooctadiene, 1,3-diphenylphosphinopropane, 1,2-bis(diphenylphosphino)ethane, or 1,4-diphenylphosphinobutane.

For example, the catalyst represented by Formula 6 may be selected from bis(1,5-cyclooctadiene)nickel(0) (Ni(COD)$_2$), 1,3-diphenylphosphinopropane nickel(II) chloride (Ni(dppp)Cl$_2$), or 1,2-bis(diphenylphosphino)ethane nickel(II) chloride (Ni(dppe)Cl$_2$).

An organic semiconducting thin film according to example embodiments may include the organic semiconducting copolymer described above. Additionally, an organic electronic device according to example embodiments may include the organic semiconducting thin film. The organic electronic device may be an organic thin film transistor, a field-emitting device, a solar cell, or a memory.

An organic thin film transistor according to example embodiments may sequentially include a gate electrode, a gate insulating layer, an organic active layer and a source/drain electrode on a substrate. Alternatively, the organic thin film transistor may sequentially include a gate electrode, a gate insulating layer, a source/drain electrode, and an organic active layer on a substrate. The organic active layer may include the organic semiconducting copolymer according to example embodiments.

The gate insulating layer may include a ferroelectric insulator, an inorganic insulator, or an organic insulator. For example, the ferroelectric insulator may be selected from $Ba_{0.33}Sr_{0.66}TiO_3$ (BST), $Al_2O_3$, $Ta_2O_5$, $La_2O_5$, $Y_2O_3$, or $TiO_2$. The inorganic insulator may be selected from $PbZr_{0.33}Ti_{0.66}O_3$ (PZT), $Bi_4Ti_3O_{12}$, $BaMgF_4$, $SrBi_2(TaNb)_2O_9$, $Ba(ZrTi)O_3$ (BZT), $BaTiO_3$, $SrTiO_3$, $Bi_4Ti_3O_{12}$, $SiO_2$, $SiN_x$, or AlON. The organic insulator may be selected from polyimide, benzocyclobutane (BCB), parylene, polyacrylate, polyvinylalcohol, or polyvinylphenol.

The gate electrode and source/drain electrode may include a material selected from gold (Au), silver (Ag), aluminum (Al), nickel (Ni), or indium tin oxide (ITO). The substrate may include a material selected from glass, polyethylenenaphthalate (PEN), polyethyleneterephthalate (PET), polycarbonate, polyvinylalcohol, polyacrylate, polyimide, polynorbornene, or polyethersulfone (PES).

BRIEF DESCRIPTION OF THE DRAWINGS

The above and other features of example embodiments may become more apparent upon review of the detailed description with reference to the attached drawings in which.

DETAILED DESCRIPTION OF EXAMPLE EMBODIMENTS

Figure 1:
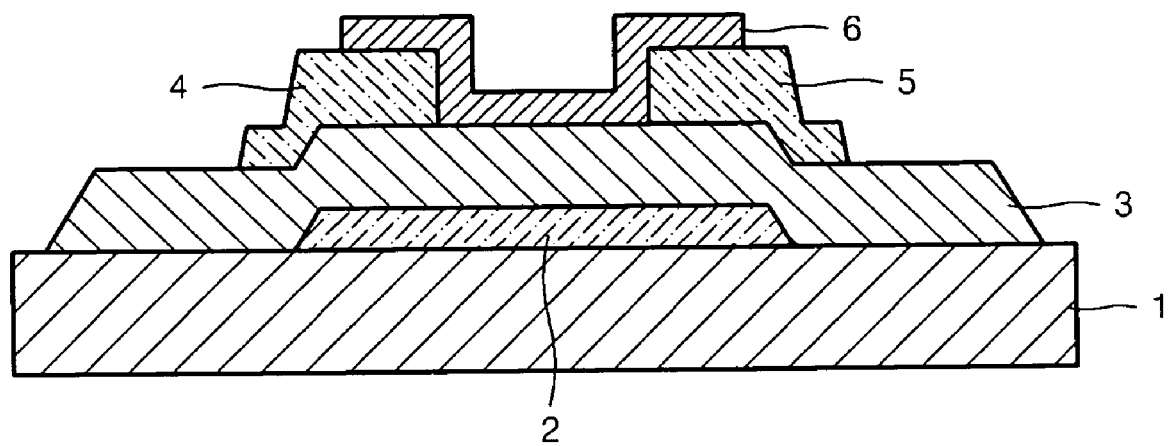
FIG. 1 is a cross-sectional view of an organic thin film transistor according to example embodiments.

It will be understood that when an element or layer is referred to as being "on", "connected to", "coupled to", or "covering" another element or layer, it may be directly on, connected to, coupled to, or covering the other element or layer or intervening elements or layers may be present. In contrast, when an element is referred to as being "directly on," "directly connected to," or "directly coupled to" another element or layer, there are no intervening elements or layers present. Like numbers refer to like elements throughout the specification. As used herein, the term "and/or" includes any and all combinations of one or more of the associated listed items.

It will be understood that, although the terms first, second, third, etc. may be used herein to describe various elements, components, regions, layers, and/or sections, these elements, components, regions, layers, and/or sections should not be limited by these terms. These terms are only used to distinguish one element, component, region, layer, or section from another element, component, region, layer, or section. Thus, a first element, component, region, layer, or section discussed below could be termed a second element, component, region, layer, or section without departing from the teachings of example embodiments.

Spatially relative terms, e.g., "beneath," "below," "lower," "above," "upper," and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" may encompass both an orientation of above and below. The device may be otherwise oriented (rotated 90 degrees or at other orientations) and the spatially relative descriptors used herein interpreted accordingly.

The terminology used herein is for the purpose of describing various embodiments only and is not intended to be limiting of example embodiments. As used herein, the singular forms "a," "an," and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments should not be construed as limited to the shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which example embodiments belong. It will be further understood that terms, including those defined in commonly used dictionaries, should be interpreted as having a meaning that is consistent with their meaning in the context of the relevant art and will not be interpreted in an idealized or overly formal sense unless expressly so defined herein.

An organic semiconducting copolymer according to example embodiments may be a polythienylthiazole-based copolymer represented by Formula 1 below:

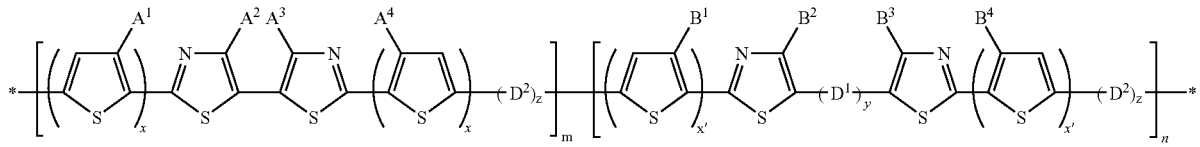

(Formula 1)

wherein $A^1$ to $A^4$ and $B^1$ to $B^4$ may each independently be hydrogen, a hydroxyl group, a $C_1$-$C_{20}$ linear, branched, or cyclic alkyl group, a $C_1$-$C_{20}$ alkoxyalkyl group, or a $C_1$-$C_{16}$ linear, branched, or cyclic alkoxy group;

$D^1$ and $D^2$ may each independently be a $C_6$-$C_{30}$ aromatic ring, a $C_4$-$C_{14}$ heteroaromatic ring, or a $C_6$-$C_{30}$ condensed polycyclic group;

x, x', and y may each independently be integers in the range of about 1 to 6;

z may be an integer in the range of about 0 to 4; and m and n may each independently be an integer greater than 0. The sum of m+n may represent a degree of polymerization and may be an integer in the range of about 5 to 200.

The copolymer represented by Formula 1 may provide a lower leakage current by maintaining a p-type semiconductivity of a thiophenyl ring and an n-type semiconductivity of a thiazole ring. The copolymer may also provide improved thin film formation and beneficial electrical properties in organic thin film transistors by introduction of spacers.

Where $D^1$ and $D^2$ are heteroaromatic rings, the heteroatoms may be sulfur, oxygen, or selenium. For example, the heteroaromatic rings may be 5-membered heteroaromatic rings including sulfur or oxygen. $D^1$ and $D^2$ may be selected from the structures below, although example embodiments are not limited thereto:

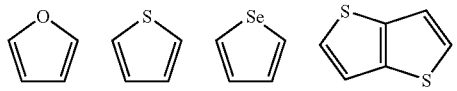

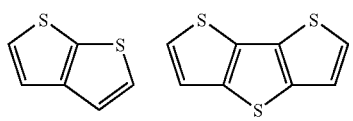

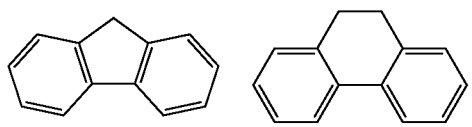

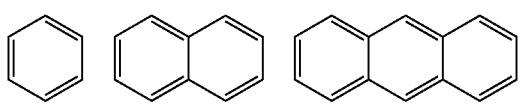

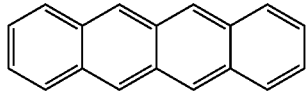

-continued

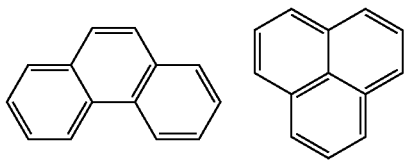

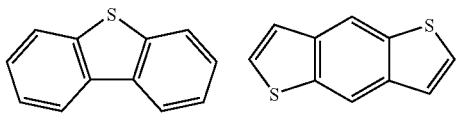

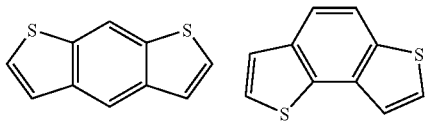

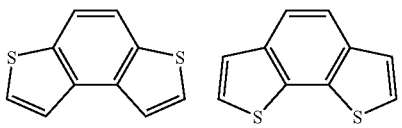

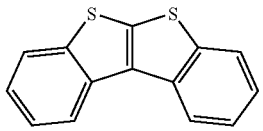

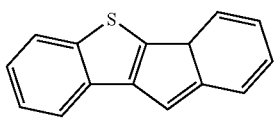

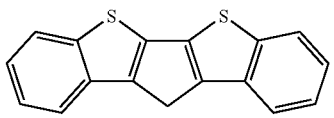

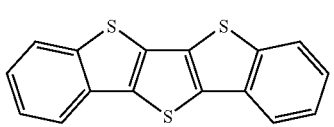

Examples of the compound of Formula 1 may include copolymers represented by Polymers 1 to 14 below, although example embodiments are not limited thereto:

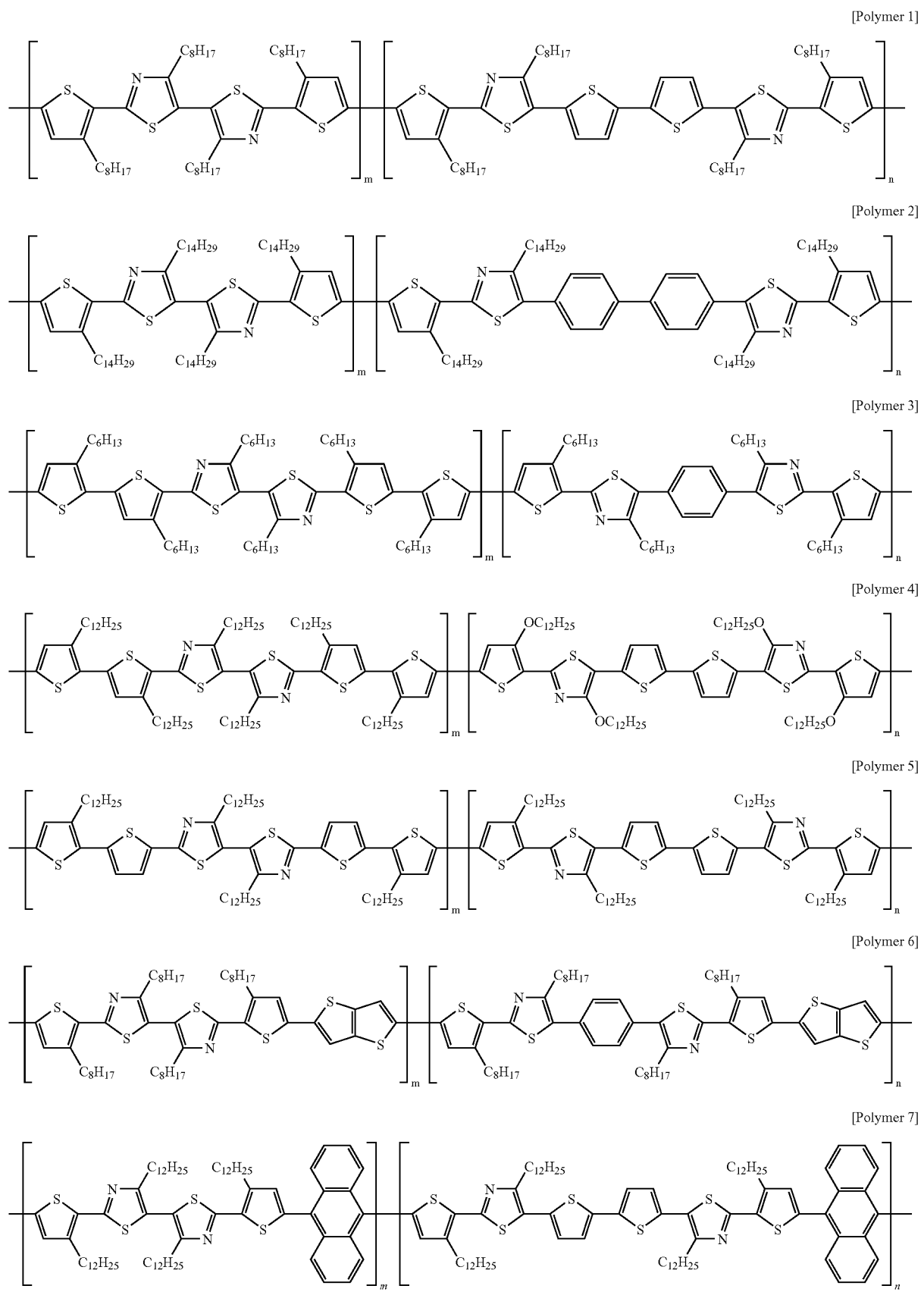

-continued
[Polymer 8]
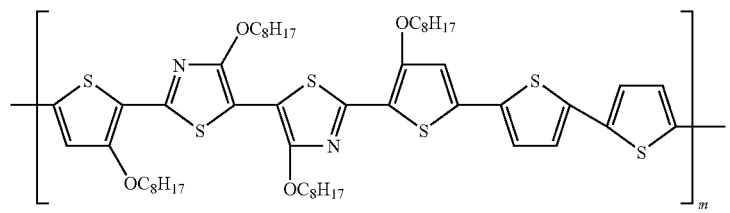
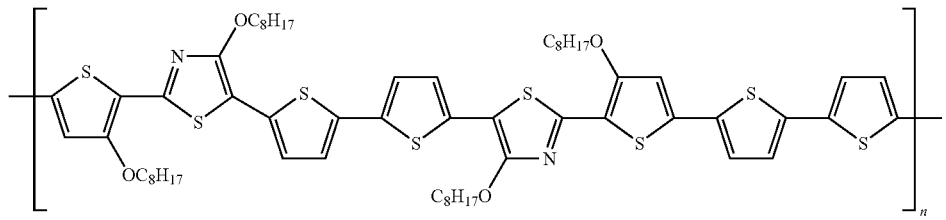
[Polymer 9]
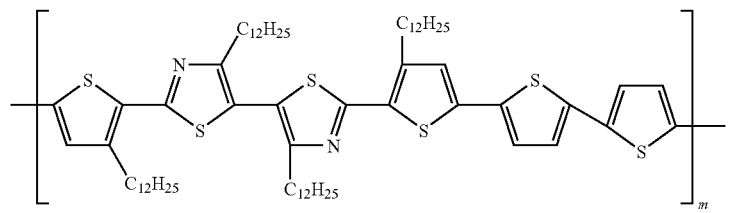
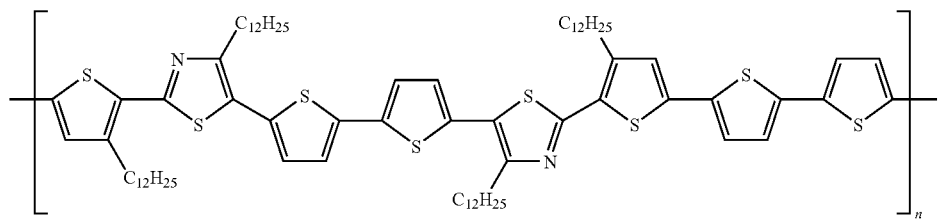
[Polymer 10]
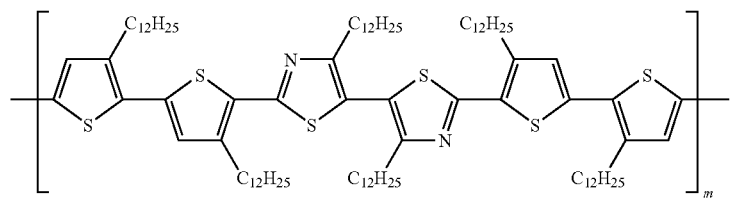
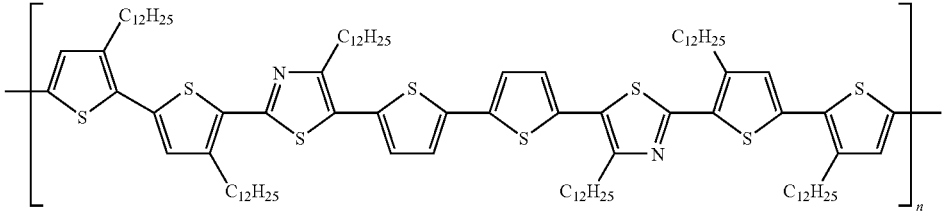
[Polymer 11]
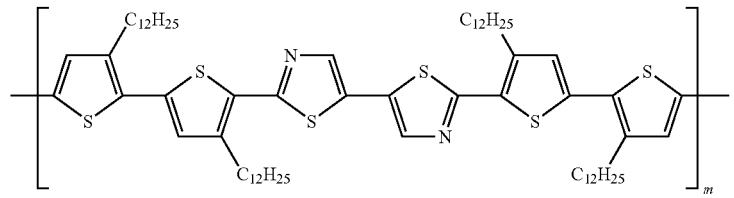

-continued
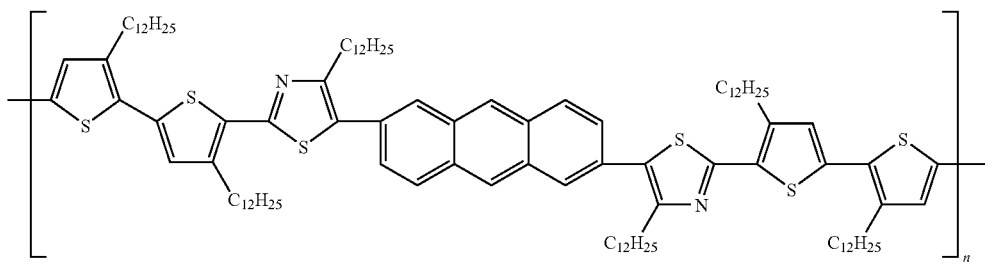
[Polymer 12]
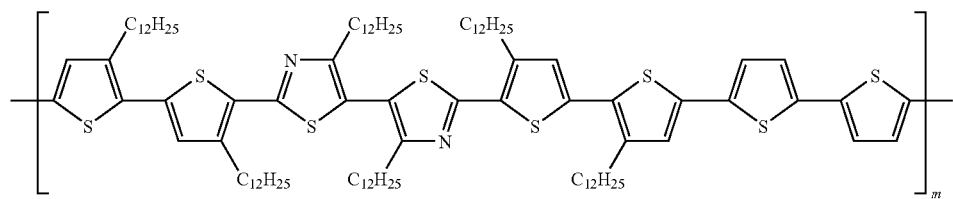
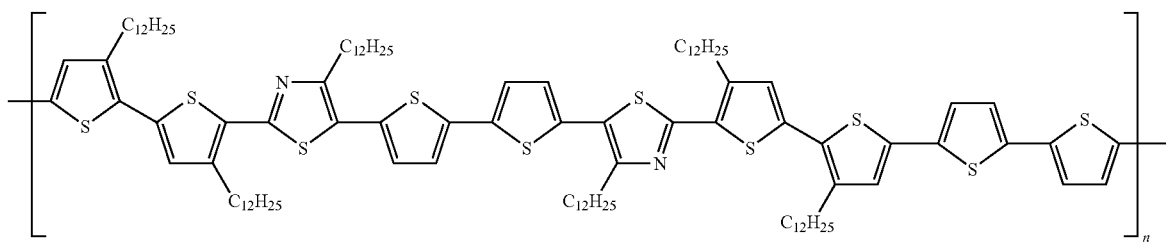
[Polymer 13]
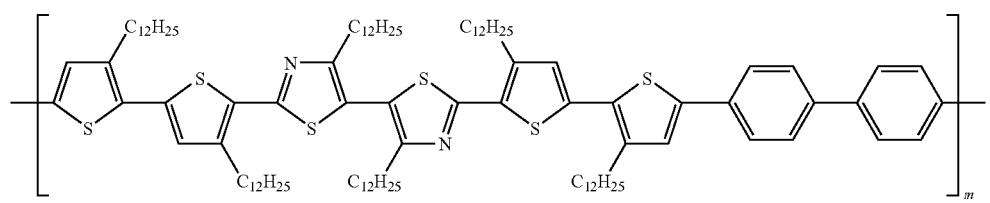
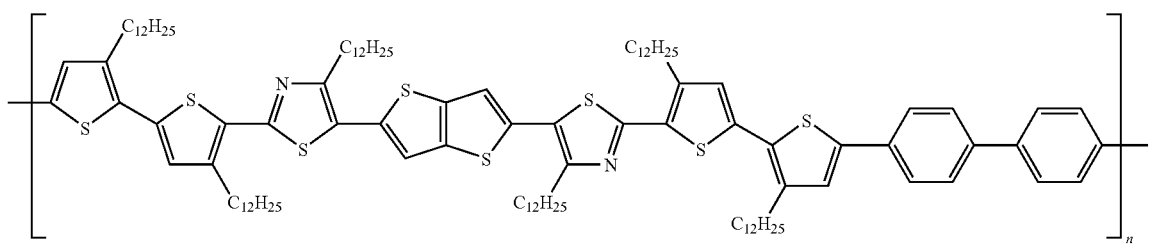
[Polymer 14]
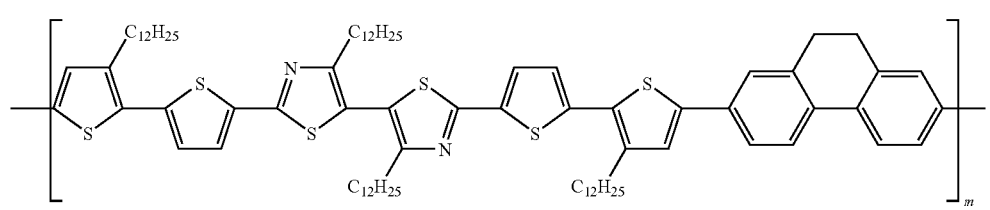
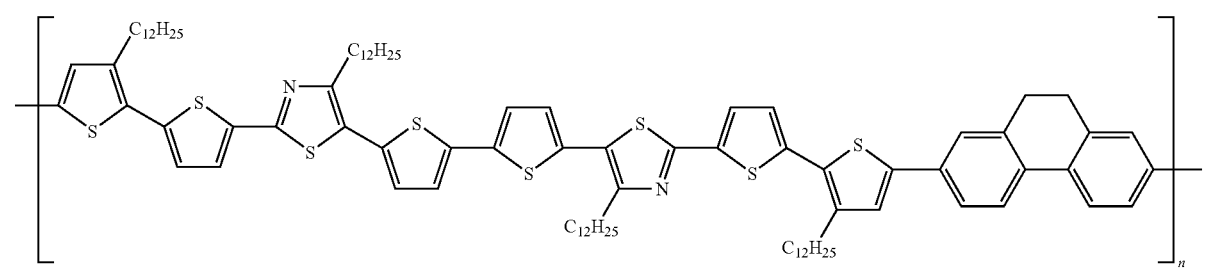

The organic semiconducting copolymer according to example embodiments may be prepared by copolymerizing monomers, represented by Formulae 2 through 4 below, using a conventional polymerization method:

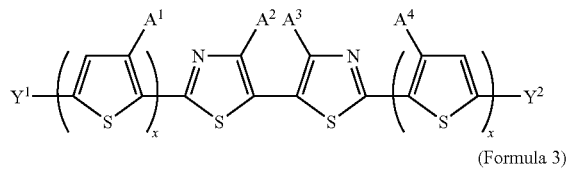

(Formula 2)

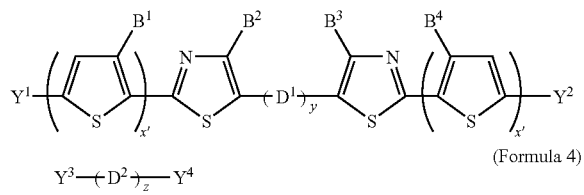

(Formula 3)

(Formula 4)

wherein $A^1$ to $A^4$, $B^1$ to $B^4$, $D^1$, $D^2$, x, x', y, and z may be as defined in connection with Formula 1; and $Y^1$ to $Y^4$ may each independently be a halogen, a trialkyl tin group, or a borane group.

Examples of synthesizing the organic semiconducting copolymer may include a synthesizing method using palladium or nickel catalysts represented by Formula 5 or 6 below, as reported by Stille, et al. (Angew. Chem. Int. Ed. Engl. 1986, Vol. 25, pp. 508-524), Suzuki, et al. (J. Am. Chem. Soc. 1989, Vol. 111, pp. 314-321), McCullough, et al. (U.S. Pat. No. 6,166,172, 1999), or Yamamoto, et al. (Macromolecules 1992, Vol. 25, pp. 1214-1226), the entire contents of which are incorporated herein by reference:

$$PdL_4 \text{ or } PdL_2Cl_2 \quad \text{(Formula 5)}$$

wherein

L may be a ligand selected from the group consisting of triphenylphosphine ($PPh_3$), triphenylarysine ($AsPh_3$), and triphenylphosphite ($P(OPh)_3$); or $$NiL' \text{ or } NiL'Cl_2 \quad \text{(Formula 6)}$$

wherein

L' may be a ligand selected from the group consisting of 1,5-cyclooctadiene, 1,3-diphenylphosphinopropane, 1,2-bis (diphenylphosphino) ethane, and 1,4-diphenylphosphinobutane.

An example of a nickel(0) catalyst may be bis(1,5-cyclooctadiene)nickel(0) ($Ni(COD)_2$). Examples of a nickel(II) catalyst may include 1,3-diphenylphosphinopropane nickel(II) chloride ($Ni(dppp)Cl_2$) and 1,2-bis(diphenylphosphino) ethane nickel(II) chloride ($Ni(dppe)Cl_2$).

The organic semiconducting copolymer according to example embodiments may be prepared using Reaction Equations 1 and 2 below, although example embodiments are not limited thereto.

Reaction Equation 1

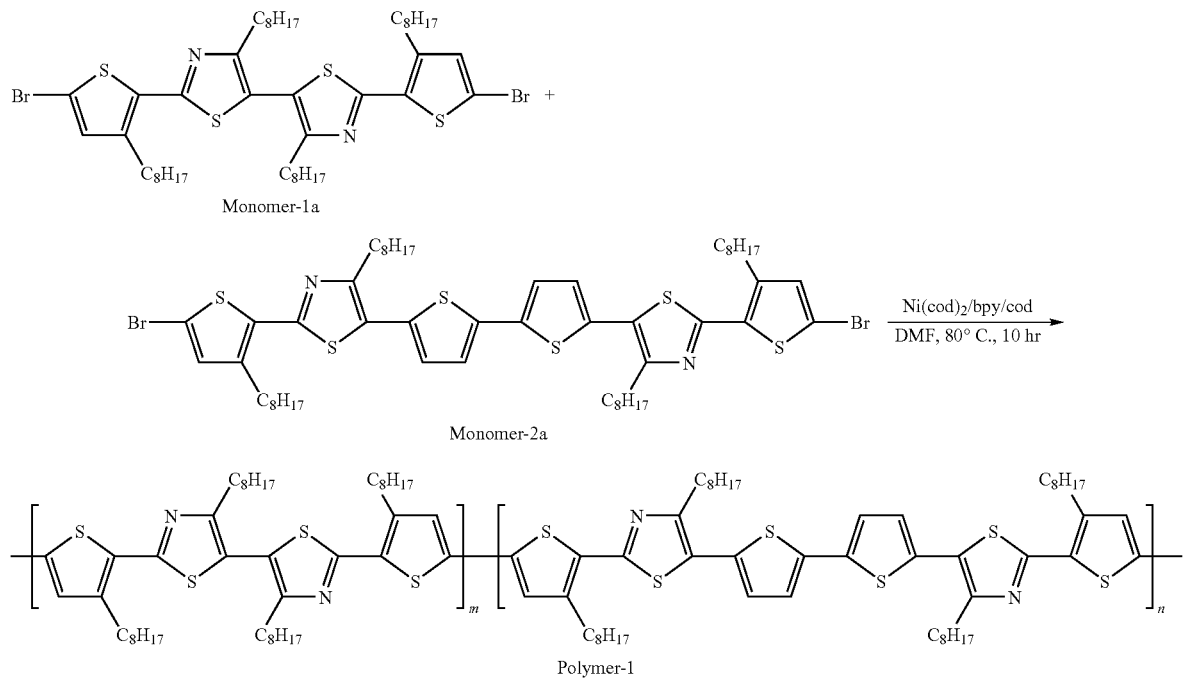

The catalyst used in the reaction may be a mixture of bis(1,5-cyclooctadiene)nickel complex as a nickel(0) compound, 2,2'-bipyridine (bpy), and 1,5-cyclooctadiene (cod) in the range of about 1 to 2 equivalents per monomer. Additionally, N,N-dimethylformamide (DMF), toluene, and/or N-methylpyrrolidone (NMP) may be used as a polymerization solvent. A condensation reaction may be performed at a temperature of about 60 to 100° C. under an inert gas atmosphere for about 6 to 48 hours.

Reaction Equation 2

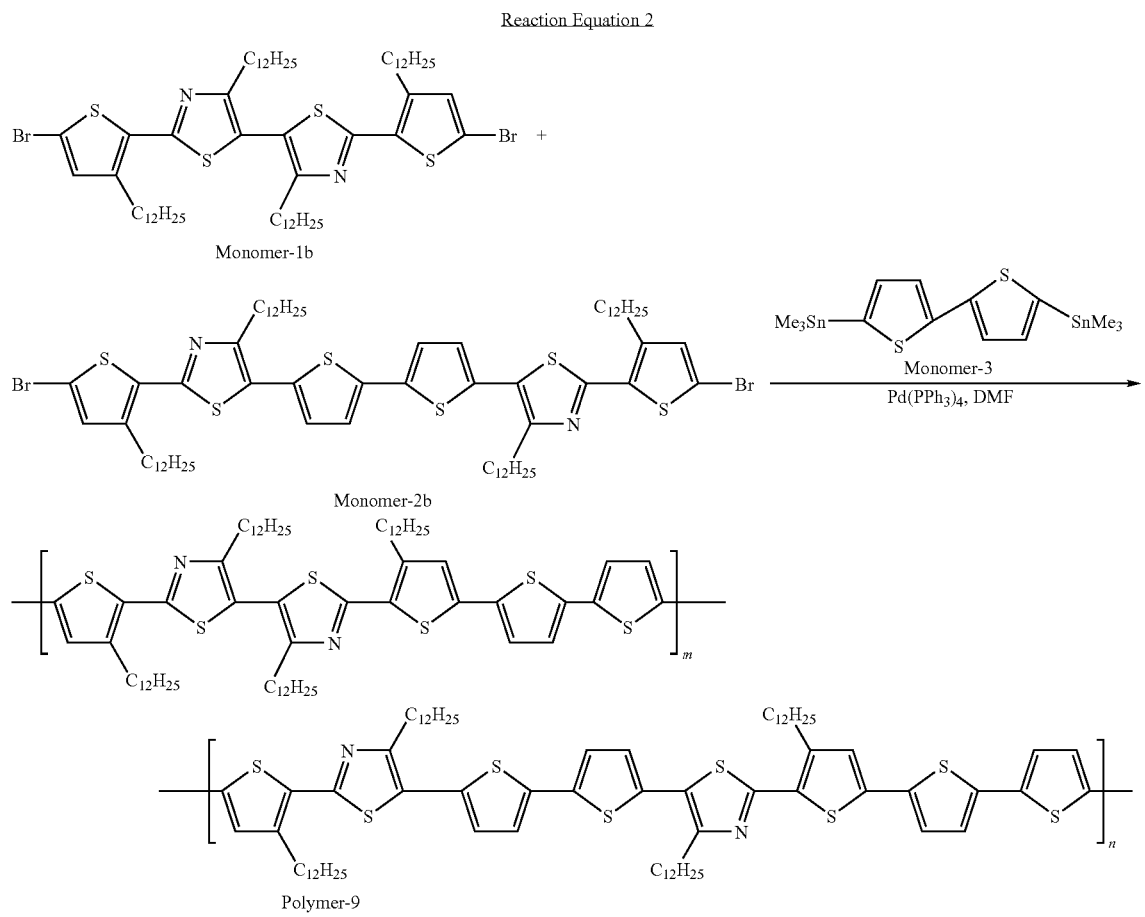

A palladium(0) compound (e.g., a tetrakis(triphenylphosphine)palladium(0) (Pd(PPh$_3$)$_4$) compound) may be used as a catalyst in the range of about 0.2 to 15.0 mol % per monomer. Additionally, the polymerization solvent may be toluene, N,N-dimethylformamide (DMF), tetrahydrofuran (THF), and/or N-methylpyrrolidone (NMP). The condensation reaction may be performed at a temperature of about 80 to 120° C. under an inert gas atmosphere for about 6 to 48 hours. A number average molecular weight of an organic semiconducting copolymer obtained by Reaction Equations 1 and 2 may be approximately 5,000 to 50,000 (e.g., approximately 10,000 or greater).

An organic semiconducting thin film may have a semiconductor layer-forming composition including the organic semiconducting copolymer according to example embodiments and an organic solvent. The organic semiconducting copolymer may have increased solubility with regard to organic solvents. As a result, a variety of conventional organic solvents may be used without particular limitation. Suitable organic solvents may include alcohols, ketones, glycols, glycol ethers, glycol ether acetates, acetates, terpineols, trimethyl pentanediol monoisobutyrate (TEXANOL), dichloroethene (DCE), chlorobenzene, and N-methyl-2-pyrrolidone (NMP). The organic solvents may be used individually or in combination with one or more other solvents.

Examples of suitable alcohols may include methyl alcohol, ethyl alcohol, n-propyl alcohol, isopropyl alcohol, n-butyl alcohol, sec-butyl alcohol, t-butyl alcohol, isobutyl alcohol, and diacetonealcohol. Examples of suitable ketones may include acetone, methylethyl ketone, and methylisobutyl ketone. Examples of suitable glycols may include ethylene glycol, diethylene glycol, triethylene glycol, propylene glycol, butylene glycol, hexylene glycol, 1,3-propanediol, 1,4-butanediol, 1,2,4-butanetriol, 1,5-pentanediol, 1,2-hexanediol, and 1,6-hexanediol. Examples of suitable glycol ethers may include ethylene glycol monomethyl ether and triethylene glycol monoethyl ether. An example of a suitable glycol ether acetate may include propylene glycol monomethyl ether acetate (PGMEA). Examples of suitable acetates may include ethyl acetate, butoxyethoxy ethyl acetate, butyl carbitol acetate (BCA), and dihydroterpineol acetate (DHTA).

The composition ratio of the semiconductor layer-forming composition may be selected as deemed appropriate by those of ordinary skill in the art. However, with regards to solubility, it may be beneficial for the composition to include about 0.1 to 10 weight % of the organic semiconducting copolymer and about 90 to 99.9 weight % of the organic solvent. For example, the composition may include about 0.5 to 4 weight % of the organic semiconducting copolymer and about 96 to 99.5 weight % of the organic solvent.

To increase the solubility and storability of the organic semiconducting copolymer, one or more suitable additives may be added according to the use and requirement of the organic semiconducting copolymer, while keeping the additives within acceptable levels so as to not interfere with the beneficial properties of the organic semiconducting copolymer. Suitable additives may include an organic binder, a photosensitive monomer, a photoinitiator, a viscosity controller, a storage stabilizer, and/or a humectant. The additive (e.g., organic binder) may be any suitable material that is well-known in the conventional field of organic electronic devices.

The organic semiconducting thin film according to example embodiments may be prepared by coating the semiconductor layer-forming composition on a substrate. The substrate is not limited to any particular material insofar as the material does not interfere with the purpose of the organic semiconducting thin film. For example, the substrate may be a glass substrate, a silicon wafer, ITO glass, quartz, silica-applied substrate, alumina-applied substrate, or a plastic substrate. Examples of suitable plastic substrates may include polyethylene naphthalate, polyethylene terephthalate, polycarbonate, polyvinyl alcohol, polyacrylate, polyimide, polynorbornene, and polyether sulfone.

The semiconductor layer-forming composition may have increased printability and processability. As a result, a conventional wet process may be performed at room temperature to coat the semiconductor layer-forming composition. For example, the semiconductor layer-forming composition may be coated using spin coating, dip coating, roll coating, screen coating, spray coating, spin casting, flow coating, screen printing, ink-jetting, or drop casting. In terms of convenience and homogeneity, it may be beneficial for the semiconductor layer-forming composition to be coated using spin coating or ink-jetting. When using the spin coating method, the spinning rate may be controlled within the range of about 100 to 10,000 rpm.

The organic semiconducting thin film according to example embodiments may have a thickness in the range of about 300 to 2,000 Å, although example embodiments are not limited thereto. As described above, the organic semiconducting thin film may be formed using an organic semiconducting copolymer having a polythienylthiazole-based repeating unit with spacers interposed therebetween. The organic semiconducting thin film may exhibit improved coplanarity and may be achieved using a relatively simple room-temperature wet process. Additionally, the organic semiconducting copolymer may maintain the beneficial properties of thiophene and thiazole. For example, the organic semiconducting copolymer may have increased electrical properties, including higher charge mobility and lower breaking leakage current. Furthermore, the improved coplanarity of the organic semiconducting thin film may render it suitable for a variety of organic electronic devices.

Thus, an organic semiconducting thin film having the above organic semiconducting copolymer may be used as a semiconductor layer of an organic electronic device according to example embodiments. For example, the organic semiconducting copolymer according to example embodiments may be used in photovoltaic devices (e.g., solar cells), organic light-emitting devices, memories, and sensors, as a core material for charge generating and transporting layers, although example embodiments are not limited thereto. Furthermore, the organic semiconducting copolymer may form an active layer of an organic thin film transistor device. The active layer may be formed by printing (e.g., screen-printing), spin-coating, dipping, or ink spraying, although example embodiments are not limited thereto.

Referring to FIG. 1, an organic thin film transistor (OTFT) device may have a substrate 1, a gate electrode 2, a gate insulating layer 3, source/drain electrodes 4 and 5, and an active layer 6. The gate electrode 2 may be formed on the substrate 1. The gate insulating layer 3 may be formed on the gate electrode 2. The source/drain electrodes 4 and 5 may be formed on the gate insulating layer 3. The active layer 6 may be formed on the source/drain electrodes 4 and 5. The active layer 6 may include the copolymer according to example embodiments. Alternatively, the source/drain electrodes 4 and 5 may be formed on the active layer 6 (not shown). However, example embodiments are not limited to the above configurations.

The gate insulating layer 3 may be a conventional insulator with relatively high permittivity. Suitable insulators may include ferroelectric insulators, inorganic insulators, or organic insulators, although example embodiments are not limited thereto. Examples of ferroelectric insulators may include barium strontium titanate ($Ba_{O.33}Sr_{O.66}TiO_3$ (BST)), $Al_2O_3$, $Ta_2O_5$, $La_2O_5$, $Y_2O_3$, and $TiO_2$. Examples of inorganic insulators may include $PbZr_{O.33}Ti_{O.66}O_3$ (PZT), $Bi_4Ti_3O_{12}$, $BaMgF_4$, $SrBi_2(TaNb)_2O_9$, $Ba(ZrTi)O_3$ (BZT), $BaTiO_3$, $SrTiO_3$, $Bi_4Ti_3O_{12}$, $SiO_2$, $SiN_x$, and AlON. Examples of organic insulators may include polyimide, benzocyclobutane (BCB), parylene, polyacrylate, polyvinylalcohol, and polyvinylphenol. Further discussion regarding conventional insulators may be found in U.S. Pat. No. 6,232,157, the entire contents of which are incorporated herein by reference.

The gate electrode 2 and source/drain electrodes 4 and 5 may be formed of metals conventionally used for such features. For example, the gate electrode 2 and source/drain electrodes 4 and 5 may be formed of gold (Au), silver (Ag), aluminum (Al), nickel (Ni), or indium tin oxide (ITO), although example embodiments are not limited thereto. The substrate 1 may be formed of glass, polyethylenenaphthalate (PEN), polyethyleneterephthalate (PET), polycarbonate, polyvinylalcohol, polyacrylate, polyimide, polynorbonene, or polyethersulfone (PES), although example embodiments are not limited thereto.

The organic semiconducting copolymer as well as the fabrication and use thereof will be described in further detail below with reference to the following examples. However, these examples are for illustrative purposes only and are not intended to limit the scope of the present disclosure.

EXAMPLES

A. Synthesis of Organic Semiconducting Copolymer

Manufacturing Example 1

Synthesis of Thiophene-Thiazole Derivative (Compound-5)

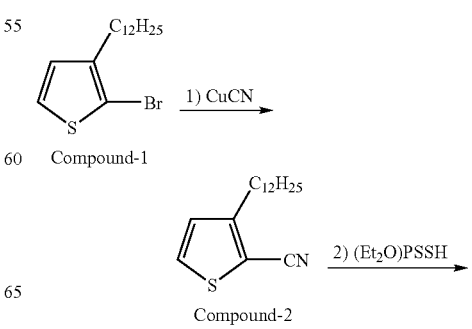

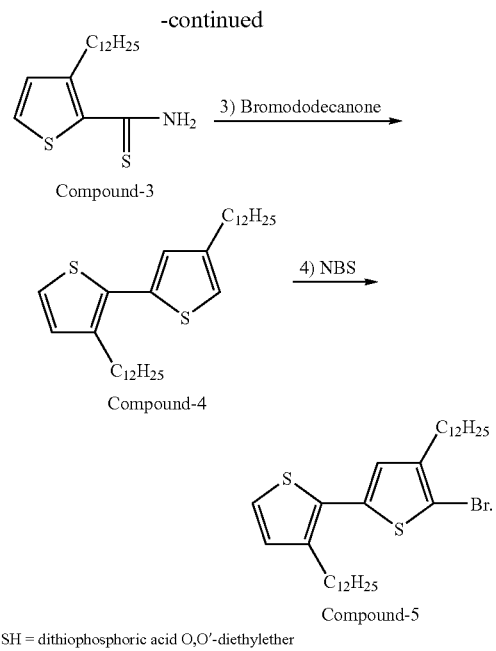

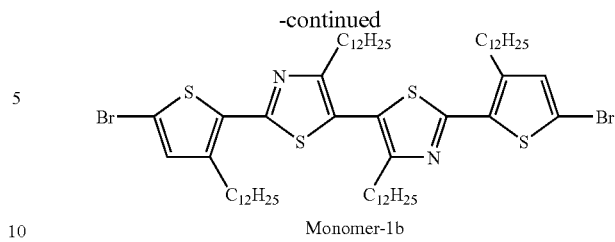

A reaction between 2-bromo-3-dodecylthiophene (Compound-1, 81.0 mmol) and excess copper cyanide (CuCN) produced 2-cyano-3-dodecylthiophene (Compound-2, 34% yield), which was heated and reacted with excess (approximately 2.5 equivalents) dithiophosphoric acid O,O'-diethylether in tetrahydrofuran (THF) solution for about 12 hours. The obtained 2-thioamino-3-dodecylthiophene (Compound-3, 45% yield) and 1.2 equivalents of bromooctanone were reacted to obtain 2-thiazole(3'-dodecyl)-3-dodecylthiophene (Compound-4, 32% yield), which was in turn reacted with N-bromosuccinimide (NBS) to obtain the thiophene-thioazol derivative (Compound-5, 82% yield). An NMR analysis result of the resultant product was as follows:

$^1$H-NMR (300 MHz, CDCl$_3$): d (ppm) 0.87 (6H), 1.25 (36H), 1.69 (4H), 2.73 (2H), 2.84 (2H), 6.92 (1H), 7.26 (1H)

Manufacturing Example 2

Manufacture of Monomer-1b

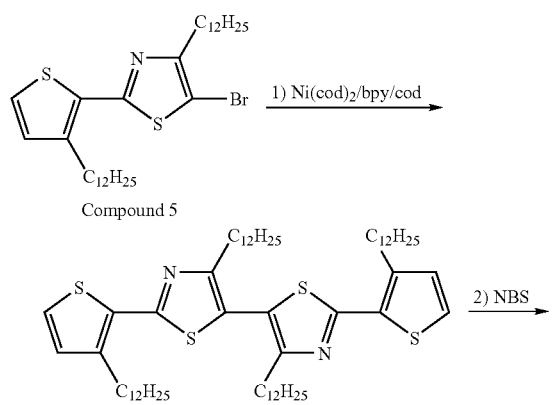

In a reactor under a nitrogen atmosphere, a nickel(0) compound (Ni(cod)$_2$, 1.044 g, 3.8 mmol), bipyridine (bpy, 0.59 g, 3.8 mmol), and cyclooctadiene (0.45 g) were added to 10 ml of anhydrous dimethyl formamide (DMF), and the mixture was stirred at 60° C. for about 30 minutes. Then, thiophene-thiazole derivative (Compound-5, 1.10 g, 1.9 mmol) obtained from Manufacturing Example 1 and 40 ml of anhydrous toluene were added to the resulting product, and was stirred at 90° C. for 48 hours. After the reaction, the reaction solution was cooled to room temperature, and the reaction was stopped by adding a mixture solution of ammonium hydroxide and methanol (mixing ratio=1:2, about 1.2 L), and stirring for about 12 hours, and the mixture was then filtered by pressure reduction. The resulting product was dissolved in toluene, and then reprecipitated several times in methanol, and then was dried at 60° C. for about 24 hours to obtain a thiazole-thiophene tetramer (yield=85%). The obtained thiazole-thiophene tetramer was reacted with NBS in chloroform solution to obtain a thiazole-containing organic compound (Monomer-1b, yield=76%). $^1$H NMR result of the obtained thiazole-containing organic compound Monomer-1b is as follows:

$^1$H-NMR (300 MHz, CDCl$_3$): d (ppm) 0.87 (t, 12H), 1.25 (m, 72H), 1.66 (m, 8H), 2.65 (t, 4H), 2.83 (t, 4H), 6.92 (s, 2H).

Manufacturing Example 3

Synthesis of Monomer-2b

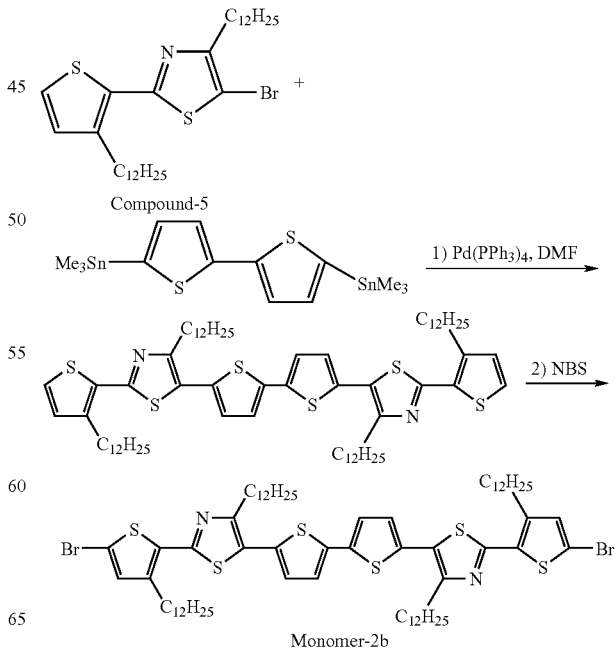

Thiophene-thiazole derivative (Compound-5, 6.99 g, 12.0 mmol) obtained from Manufacturing Example 1 and 0.5 equivalent of bis(trismethylstenyl)bithiophene (3.0 g, 0.6 mmol) were added to a reactor under a nitrogen atmosphere and heated lightly to completely dissolve in anhydrous DMF. Further details may be found in C. van Pham, et al., J. Org. Chem, 1984, Vol. 49, 5250, the entire contents of which are incorporated herein by reference. Then, a palladium(0) compound Pd(PPh$_3$)$_4$ was added as a catalyst (10 mol % based on the entire monomers), and the mixture was reacted at a temperature of 85-90° C. for 12 hours. After completion of the reaction, diluted hydrochloric acid solution was added to the reaction mixture, and then the organic product was extracted with chloroform. An organic layer obtained was distilled under reduced pressure to remove the solvent and was lightly washed with methanol and dried. By reacting the resulting thiazole-containing intermediate with NBS under chloroform solution, a thiazole-containing organic compound (Monomer-2b) was obtained (Yield=46%). A $^1$H-NMR analysis result of the obtained tiazol-containing organic compound (Monomer-2b) is as follows:

$^1$H-NMR (300 MHz, CDCl$_3$): d (ppm) 0.87 (t, 12H), 1.25 (m, 72H), 1.75 (m, 8H), 2.75 (t, 4H), 2.82 (t, 4H), 6.92 (s, 2H), 7.11 (d, 2H), 7.16 (d, 2H).

Synthesis Example 1

Synthesis of Organic Semiconducting Copolymer (Polymer-9)

The thiazole-containing organic compound (Monomer-1b, 0.71 g, 0.61 mmol) obtained from Manufacturing Example 2, the thiazole-containing organic compound (Monomer-2b, 0.81 g, 0.61 mmol) obtained from Manufacturing Example 3, and bis(trimethylstenyl)thiophene (described in further detail in C. van Pham, et al., J. Org. Chem, 1984, Vol. 49, 5250, the entire contents of which are incorporated herein by reference) (0.6 g, 1.22 mmol) were added to a reactor under a nitrogen atmosphere and heated lightly to completely dissolve in anhydrous DMF. A palladium(0) compound Pd(PPh$_3$)$_4$ (10 mol % based on the entire monomers) was added as a polymerization catalyst and was reacted at a temperature of 85° C. for 5-6 hours. After completion of the reaction, the reaction mixture was cooled to room temperature and filtered. The obtained solid was sequentially washed twice with hydrochloric acid solution/chloroform, twice with ammonium hydroxide/chloroform, and twice with water/chloroform and then reprecipitated in methanol for recovery. The resulting product was dried to obtain an indigo-colored organic semiconducting copolymer (Polymer-9) (Yield=56%, number average molecular weight=25,000). An NMR analysis result of the resultant product was as follows:

$^1$H-NMR (300 MHz, CDCl$_3$): d (ppm) 0.87 (—CH3),1.23 (—(CH2)9-), 1.72 (—CH2-), 2.71 (Aromatic-CH2-), 2.81 (Aromatic-CH2-), 2.92 (Aromatic-CH2-), 6.90, 7.01, 7.04, 7.09, 7.16.

Synthesis Example 2

Synthesis of Organic Semiconducting Copolymer (Polymer-12)

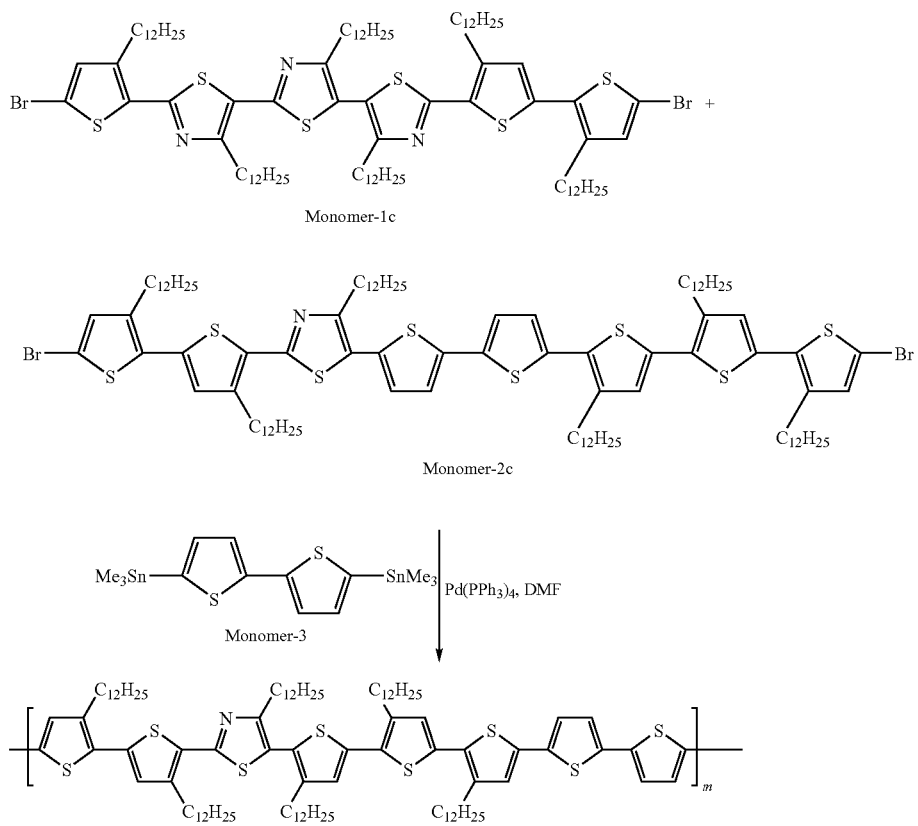

-continued

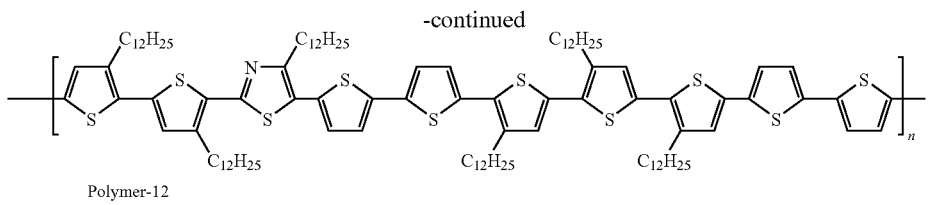

Polymer-12

A dark-indigo colored organic semiconducting copolymer (Polymer-12) was synthesized using the same method as in Synthesis Example 1, except that thiophene-thiazole derivatives (Monomer-1c and Monomer-2c) and bis(trimethylstenyl)bithiophene (Monomer-3) were used as monomers (Yield=62%, number average molecular weight=28,000). An NMR analysis result of the resultant product was as follows:

$^1$H-NMR (300 MHz, CDCl$_3$): d (ppm) 0.87 (—CH3), 1.25 (—(CH2)9-), 1.72 (—CH2-), 2.71 (Aromatic-CH2-), 2.81 (Aromatic-CH2-), 2.92 (Aromatic-CH2-), 6.91, 7.01, 7.03, 7.09, 7.17.

B. Manufacture of Organic Thin-Film Transistor

Example 1

Manufacture of Organic Thin-Film Transistor Including Organic Semiconducting Copolymer (Polymer-9)

Chrome as a gate electrode material was deposited on a cleaned glass substrate to a thickness of 1000 Å by sputtering, and SiO$_2$ as a gate insulating layer material was deposited to a thickness of 1000 Å thereon by chemical vacuum deposition (CVD). Then, Au as a source-drain electrode was deposited to a thickness of 1200 Å thereon by sputtering. Before deposition of the organic semiconducting materials, the resulting structure was washed with isopropyl alcohol for 10 minutes and dried. The resulting structure was then dipped in octadecyltricholorosilane solution diluted in choloroform to a concentration of 10 mM for 30 seconds and washed with acetone and dried. Then, the obtained organic semiconducting copolymer (Polymer-9) from Synthesis Example 1 was dissolved in THF at a concentration of 0.1 weight % and applied to the resulting structure by an inkjet printing method and was baked under an argon atmosphere at a temperature of 150° C. for 1 hour to produce an OTFT device.

Example 2

Manufacture of Organic Thin-Film Transistor Including Organic Semiconducting Copolymer (Polymer-12)

An OTFT device was manufactured using the same method as in Example 1, except that the organic semiconducting copolymer (Polymer-12) obtained from Synthesis Example 2 was used as an active layer.

Comparative Example

Manufacture of Organic Thin-Film Transistor

An OTFT device was manufactured using the same method as in Example 1, except that polyhexylthiophene HT-P3HT (Aldrich Co.) was used as an active layer.

C. Evaluation of Electrical Properties of Organic Thin-Film Transistor

Figure 2:
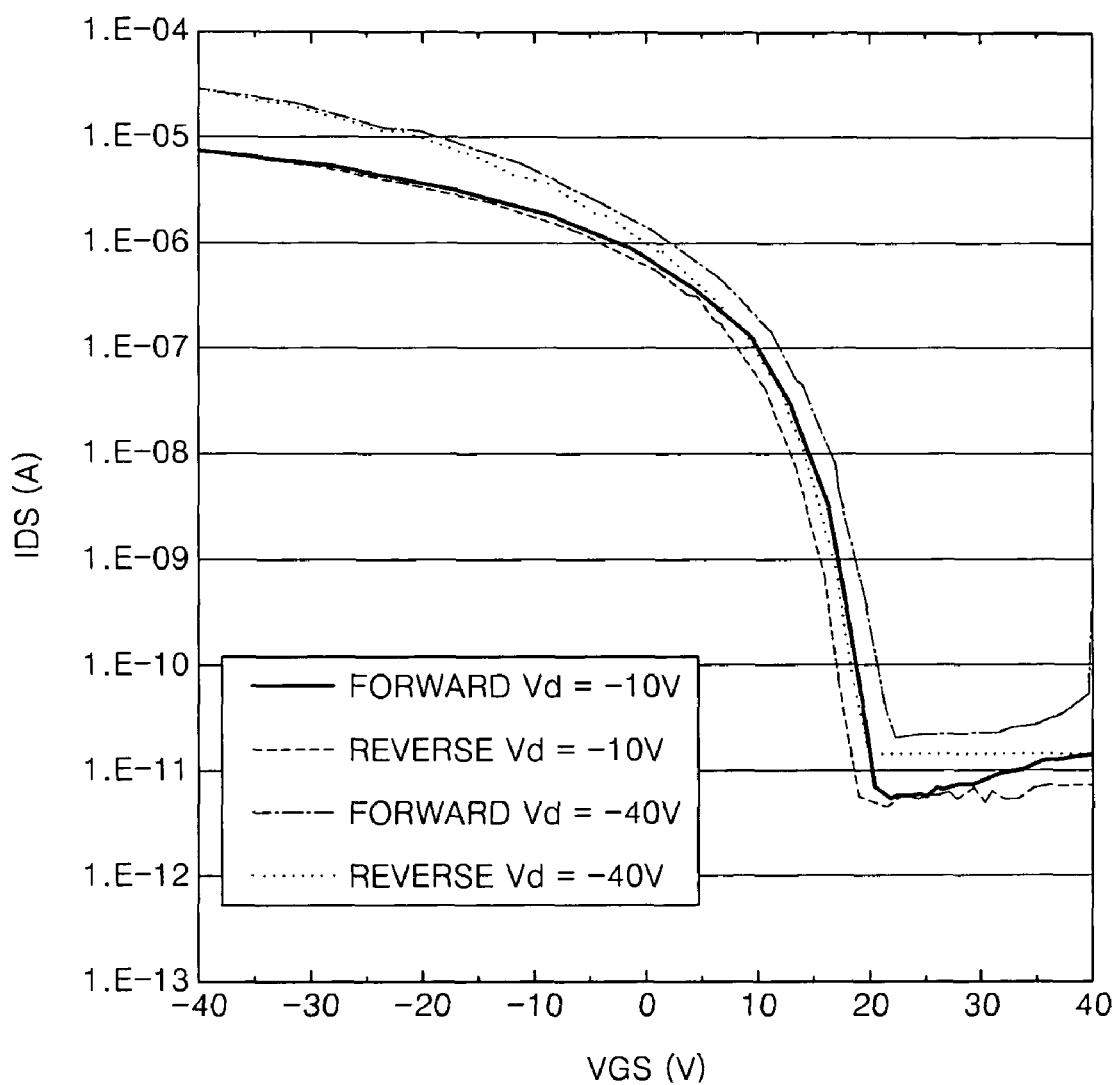
FIG. 2 is a graph illustrating a current transfer characteristic curve of an organic thin film transistor manufactured in Example 2 according to example embodiments.

To evaluate the electrical properties of the organic thin-film transistor manufactured in Examples 1 and 2 and the Comparative Example, current transfer curves were obtained using a Semiconductor Analyzer (4200-SCS) by Keithley. The current transfer curves obtained from Example 2 are shown in FIG. 2. Charge mobility was obtained from a slope of a graph obtained from a current formula of the saturation region expressed below with $(I_{SD})^{1/2}$ and $V_G$ as variables, using the current transfer curve:

$$I_{SD} = \frac{WC_o}{2L}\mu_{FET}(V_G - V_T)^2$$

wherein
$I_{SD}$ is the source-drain current,
$\mu$ or $\mu_{FET}$ is the current mobility,
$C_0$ is the constant electrocapacity of the oxidation layer,
W is the channel width,
L is the channel length,
$V_G$ is the gate voltage, and
$V_T$ is the threshold voltage.

Current on/off ratio was calculated using a ratio between the maximum current in the on state and the minimum current in the off state. Breaking leakage current ($I_{off}$) is current flowing in the off state, and a minimum current at the off state was taken.

TABLE 1

|  | Charge Mobility (cm$^2$/Vs) | Current on/off Ratio | Breaking leakage current (A) |
| --- | --- | --- | --- |
| Example 1 | 0.12 | 4.0 × 10$^5$ | 1.0 × 10$^{-11}$ |
| Example 2 | 0.30 | 1.2 × 10$^6$ | 7 × 10$^{-12}$ |
| Comparative Example | 0.0008 | 400 | 7 × 10$^{-9}$ |

Referring to Table 1, the OTFT devices of Examples 1 and 2, which include the organic semiconducting copolymer according to example embodiments, have better electrical properties in terms of charge mobility, current on/off ratio, and breaking leakage current compared to the Comparative Example.

As discussed above, in addition to its improved electrical properties, the organic semiconducting copolymer according to example embodiments may include a thiazole-containing repeating unit with spacers disposed therebetween, thus providing better solubility, coplanarity, processability, and thin film properties than conventional semiconducting materials.

While example embodiments have been disclosed herein, it should be understood that other variations may be possible. Such variations are not to be regarded as a departure from the spirit and scope of example embodiments of the present application, and all such modifications as would be obvious to one skilled in the art are intended to be included within the scope of the following claims.

What is claimed is:

1. An organic semiconducting copolymer represented by Formula 1 below:

(Formula 1)

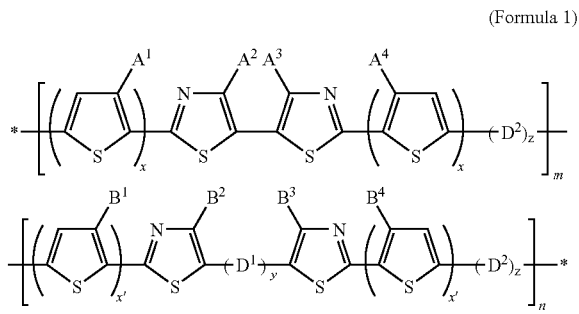

wherein $A^1$ to $A^4$ and $B^1$ to $B^4$ are each independently selected from hydrogen, a hydroxyl group, a $C_1$-$C_{20}$ alkyl group, a $C_1$-$C_{20}$ alkoxyalkyl group, or a $C_1$-$C_{16}$ alkoxy group;

$D^1$ and $D^2$ are each independently selected from the structures below:

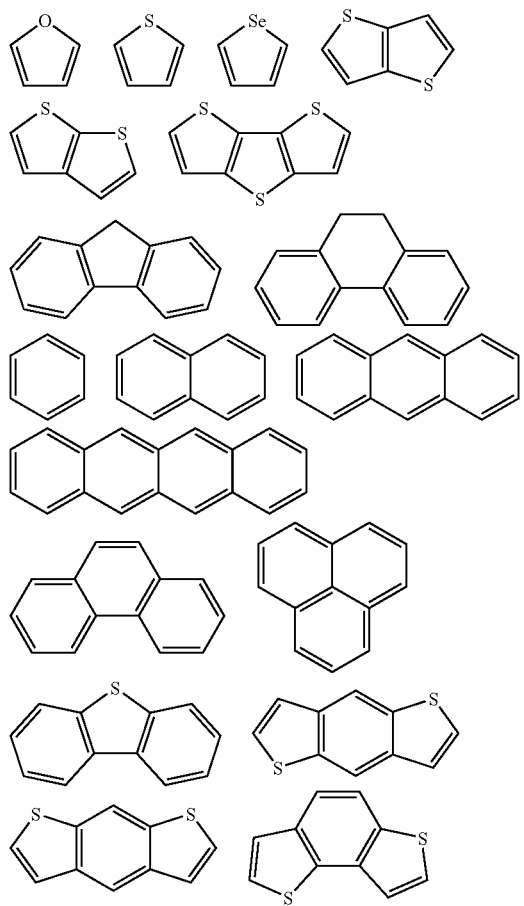

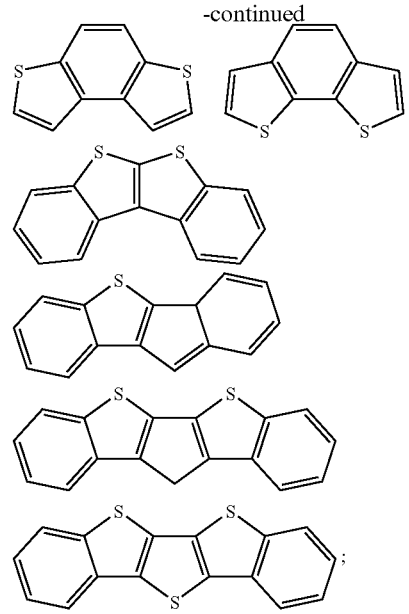

x, x', and y are each an integer in the range of about 1 to 6;

z is an integer in the range of about 0 to 4; and m and n are each an integer greater than 0, the sum of m+n representing a degree of polymerization and being an integer in the range of about 5 to 200.

2. The copolymer of claim 1, wherein the alkyl group is a linear, branched, or cyclic alkyl group.

3. The copolymer of claim 1, wherein the alkoxy group is a linear, branched, or cyclic alkoxy group.

4. The copolymer of claim 1, wherein the copolymer is formed by copolymerizing compounds represented by Formulae 2 through 4 below:

(Formula 2)

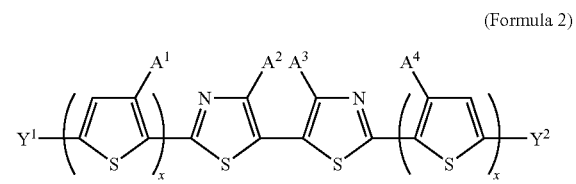

wherein $Y^1$ and $Y^2$ are each independently selected from a halogen, a trialkyl tin group, or a borane group, and x is an integer ranging from about 1 to 6;

(Formula 3)

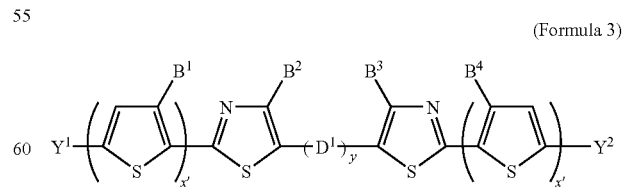

wherein $Y^1$ and $Y^2$ are each independently selected from a halogen, a trialkyl tin group, or a borane group, and x' and y are each an integer ranging from about 1 to 6;

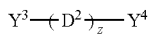  (Formula 4)

wherein
Y³ and Y⁴ are each independently selected from a halogen, a trialkyl tin group, or a borane group, and
z is an integer ranging from about 1 to 4.

5. The copolymer of claim 4, wherein the copolymer is formed with a catalyst represented by one of Formulae 5 and 6 below:

  (Formula 5)

wherein L is a ligand selected from triphenylphosphine (PPh₃), triphenylarysine (AsPh₃), or triphenylphosphite (P(OPh)₃); and

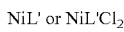  (Formula 6)

wherein L' is a ligand selected from 1,5-cyclooctadiene, 1,3-diphenylphosphinopropane, 1,2-bis(diphenylphosphino)ethane, or 1,4-diphenylphosphinobutane.

6. The copolymer of claim 5, wherein the catalyst represented by Formula 6 is selected from bis(1,5-cyclooctadiene) nickel(0) (Ni(COD)₂), 1,3-diphenylphosphinopropane nickel (II) chloride (Ni(dppp)Cl₂), or 1,2-bis(diphenylphosphino)ethane nickel(II) chloride (Ni(dppe)Cl₂).

7. An organic semiconducting thin film comprising the organic semiconducting copolymer of claim 1.

8. An organic electronic device comprising the organic semiconducting thin film of claim 7.

9. The organic electronic device of claim 8, wherein the organic electronic device is an organic thin film transistor, a field-emitting device, a solar cell, or a memory.

10. The organic electronic device of claim 9, wherein the organic thin film transistor sequentially includes a gate electrode, a gate insulating layer, an organic active layer, and a source/drain electrode on a substrate, the organic active layer including the organic semiconducting copolymer.

11. The organic electronic device of claim 9, wherein the organic thin film transistor sequentially includes a gate electrode, a gate insulating layer, a source/drain electrode, and an organic active layer on a substrate, the organic active layer including the organic semiconducting copolymer.

12. The organic electronic device of claim 11, wherein the gate electrode and source/drain electrode include a material selected from gold (Au), silver (Ag), aluminum (Al), nickel (Ni), or indium tin oxide (ITO).

13. The organic electronic device of claim 11, wherein the substrate includes a material selected from glass, polyethylenenaphthalate (PEN), polyethyleneterephthalate (PET), polycarbonate, polyvinylalcohol, polyacrylate, polyimide, polynorbornene, or polyethersulfone (PES).

14. The organic electronic device of claim 11, wherein the gate insulating layer includes a ferroelectric insulator, an inorganic insulator, or an organic insulator.

15. The organic electronic device of claim 14, wherein the ferroelectric insulator is selected from $Ba_{O.33}Sr_{O.66}TiO_3$ (BST), $Al_2O_3$, $Ta_2O_5$, $La_2O_5$, $Y_2O_3$, or $TiO_2$.

16. The organic electronic device of claim 14, wherein the inorganic insulator is selected from $PbZr_{O.33}Ti_{O.66}O_3$(PZT), $Bi_4Ti_3O_{12}$, $BaMgF_4$, $SrBi_2(TaNb)_2O_9$, $Ba(ZrTi)O_3$(BZT), $BaTiO_3$, $SrTiO_3$, $Bi_4Ti_3O_{12}$, $SiO_2$, $SiN_x$, or AlON.

17. The organic electronic device of claim 14, wherein the organic insulator is selected from polyimide, benzocyclobutane (BCB), parylene, polyacrylate, polyvinylalcohol, or polyvinylphenol.

* * * * *